(12) United States Patent
Yamaga

(10) Patent No.: US 8,312,348 B2
(45) Date of Patent: Nov. 13, 2012

(54) ERROR CORRECTING DEVICE AND ERROR CORRECTING METHOD

(75) Inventor: Akira Yamaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 897 days.

(21) Appl. No.: 12/394,660

(22) Filed: Feb. 27, 2009

(65) Prior Publication Data

US 2009/0222708 A1 Sep. 3, 2009

(30) Foreign Application Priority Data

Mar. 1, 2008 (JP) .................................. 2008-051461

(51) Int. Cl.
*G06F 11/00* (2006.01)
(52) U.S. Cl. ........................................................ 714/768
(58) Field of Classification Search ................... 714/768
See application file for complete search history.

(56) References Cited

U.S. PATENT DOCUMENTS

| | | | | |
|---|---|---|---|---|
| 5,099,482 A * | 3/1992 | Cameron | ........................ | 714/784 |
| 5,241,546 A * | 8/1993 | Peterson et al. | .............. | 714/761 |
| 5,684,810 A * | 11/1997 | Nakamura et al. | ............ | 714/755 |
| 7,509,564 B2 * | 3/2009 | Dohmen et al. | .............. | 714/782 |
| 8,086,933 B2 | 12/2011 | Yamaga | | |
| 2003/0140301 A1 * | 7/2003 | Litwin et al. | ................... | 714/784 |
| 2004/0123225 A1 * | 6/2004 | Cameron | ........................ | 714/781 |
| 2006/0174181 A1 * | 8/2006 | Banks et al. | ................... | 714/784 |
| 2008/0163033 A1 * | 7/2008 | Yim | .............................. | 714/785 |
| 2008/0301524 A1 | 12/2008 | Horisaki et al. | | |
| 2009/0150754 A1 * | 6/2009 | Dohmen et al. | .............. | 714/785 |
| 2011/0047441 A1 | 2/2011 | Yamaga | | |
| 2011/0239085 A1 * | 9/2011 | Yeung et al. | ................... | 714/758 |

FOREIGN PATENT DOCUMENTS

| | | |
|---|---|---|
| JP | 61-60618 | 12/1986 |
| JP | 63-275225 | 11/1988 |
| JP | 64-32724 | 2/1989 |
| JP | 2-301328 | 12/1990 |
| JP | 3-22629 | 1/1991 |
| JP | 3-117923 | 5/1991 |
| JP | 5-218883 | 8/1993 |
| JP | 5-298131 | 11/1993 |
| JP | 7-202717 | 8/1995 |

(Continued)

OTHER PUBLICATIONS

Office Action issued Oct. 1, 2010, in Japan Patent Application No. 2008-051461 (with English translation).

(Continued)

*Primary Examiner* — Bryce Bonzo
(74) *Attorney, Agent, or Firm* — Oblon, Spivak, McClelland, Maier & Neustadt, L.L.P.

(57) ABSTRACT

An error correcting device for correcting erroneous data included in data read out from a nonvolatile memory includes a determining unit that determines whether the data read out from the nonvolatile memory include an error beyond an error correcting capability of the error correcting device. When the determining unit has determined that an error beyond the error correcting capability exists, the error correcting device does not perform the correction of the error.

14 Claims, 16 Drawing Sheets

FOREIGN PATENT DOCUMENTS

| | | |
|---|---|---|
| JP | 8-130480 | 5/1996 |
| JP | 9-116442 | 5/1997 |
| JP | 11-73796 | 3/1999 |
| JP | 2999881 | 11/1999 |
| JP | 2004-280556 | 7/2004 |
| JP | 2004-220730 | 8/2004 |
| JP | 2005-72975 | 3/2005 |
| JP | 2007-87464 | 4/2007 |

OTHER PUBLICATIONS

U.S. Appl. No. 13/334,438, filed Dec. 22, 2011, Yamaga.
Office Action issued on Oct. 5, 2010, in Japan Patent Application No. 2008-051461 (with English translation).
U.S. Appl. No. 13/176,030, filed Jul. 5, 2011, Izumi, et al.
Office Action issued Jul. 3, 2012, in Japanese Patent Application No. 2011-005935 with English-language translation.

* cited by examiner

RESULTS OF FIRST ERROR
CORRECTION PROCESSING

| 0 | 1 | 2 | 3 |
|---|---|---|---|
| 1 | 0 | 1 | 0 |
| BK0 | BK1 | BK2 | BK3 |

BK: BLOCK

FIG.9A b0[0] = a0[7]
b0[1] = a0[0]
b0[2] = a0[1] ⊕ a0[7]
b0[3] = a0[2] ⊕ a0[7]
b0[4] = a0[3] ⊕ a0[7]
b0[5] = a0[4]
b0[6] = a0[5]
b0[7] = a0[6]

⊕ REPRESENTS EXOR COMPUTATION

FIG.9B c0[0] = a0[0] ⊕ a0[1] ⊕ a0[4] ⊕ a0[7]
c0[1] = a0[1] ⊕ a0[2] ⊕ a0[5]
c0[2] = a0[0] ⊕ a0[1] ⊕ a0[2] ⊕ a0[3] ⊕ a0[4] ⊕ a0[6] ⊕ a0[7]
c0[3] = a0[0] ⊕ a0[2] ⊕ a0[3] ⊕ a0[5]
c0[4] = a0[0] ⊕ a0[3] ⊕ a0[6] ⊕ a0[7]
c0[5] = a0[1] ⊕ a0[4] ⊕ a0[7]
c0[6] = a0[2] ⊕ a0[5]
c0[7] = a0[0] ⊕ a0[3] ⊕ a0[6]

⊕ REPRESENTS EXOR COMPUTATION

FIG.9C d0[0] = a0[1] ⊕ a0[2] ⊕ a0[6] ⊕ a0[7]
d0[1] = a0[0] ⊕ a0[2] ⊕ a0[3] ⊕ a0[7]
d0[2] = a0[0] ⊕ a0[2] ⊕ a0[3] ⊕ a0[4] ⊕ a0[6] ⊕ a0[7]
d0[3] = a0[0] ⊕ a0[2] ⊕ a0[3] ⊕ a0[4] ⊕ a0[5] ⊕ a0[6]
d0[4] = a0[2] ⊕ a0[3] ⊕ a0[4] ⊕ a0[5]
d0[5] = a0[3] ⊕ a0[4] ⊕ a0[5] ⊕ a0[6]
d0[6] = a0[0] ⊕ a0[4] ⊕ a0[5] ⊕ a0[6] ⊕ a0[7]
d0[7] = a0[0] ⊕ a0[1] ⊕ a0[5] ⊕ a0[6] ⊕ a0[7]

⊕ REPRESENTS EXOR COMPUTATION

FIG.9D b1[0] = a1[6]
b1[1] = a1[7]
b1[2] = a1[0] ⊕ a1[6]
b1[3] = a1[1] ⊕ a1[6] ⊕ a1[7]
b1[4] = a1[2] ⊕ a1[6] ⊕ a1[7]
b1[5] = a1[3] ⊕ a1[7]
b1[6] = a1[4]
b1[7] = a1[5]

⊕REPRESENTS EXOR COMPUTATION

FIG.9E c1[0] = a1[0] ⊕ a1[2] ⊕ a1[4] ⊕ a1[5]
c1[1] = a1[0] ⊕ a1[1] ⊕ a1[3] ⊕ a1[5] ⊕ a1[6]
c1[2] = a1[0] ⊕ a1[1] ⊕ a1[5] ⊕ a1[6] ⊕ a1[7]
c1[3] = a1[0] ⊕ a1[1] ⊕ a1[4] ⊕ a1[5] ⊕ a1[6] ⊕ a1[7]
c1[4] = a1[0] ⊕ a1[1] ⊕ a1[4] ⊕ a1[6] ⊕ a1[7]
c1[5] = a1[1] ⊕ a1[2] ⊕ a1[5] ⊕ a1[7]
c1[6] = a1[0] ⊕ a1[2] ⊕ a1[3] ⊕ a1[6]
c1[7] = a1[1] ⊕ a1[3] ⊕ a1[4] ⊕ a1[7]

⊕REPRESENTS EXOR COMPUTATION

FIG.9F d1[0] = a1[1] ⊕ a1[6]
d1[1] = a1[0] ⊕ a1[2] ⊕ a1[7]
d1[2] = a1[3] ⊕ a1[6]
d1[3] = a1[0] ⊕ a1[1] ⊕ a1[4] ⊕ a1[6] ⊕ a1[7]
d1[4] = a1[2] ⊕ a1[5] ⊕ a1[6] ⊕ a1[7]
d1[5] = a1[3] ⊕ a1[6] ⊕ a1[7]
d1[6] = a1[4] ⊕ a1[7]
d1[7] = a1[0] ⊕ a1[5]

⊕REPRESENTS EXOR COMPUTATION

ERROR CORRECTING DEVICE AND ERROR CORRECTING METHOD

CROSS-REFERENCE TO RELATED APPLICATIONS

This application is based upon and claims the benefit of priority from the prior Japanese Patent Applications No. 2008-051461, filed on Mar. 1, 2008, the entire contents of which are incorporated herein by reference.

BACKGROUND OF THE INVENTION

1. Field of the Invention

The present invention relates to an error correcting device and an error correcting method. More specifically, the present invention relates to an error correcting device and an error correcting method that correct erroneous data included in data read out from a nonvolatile memory.

2. Description of the Related Art

Semiconductor elements such as flash memories, which store information depending upon held charge amount, have recently become widely known. A multivalued memory technique, in which information of two bits or more is stored by setting a plurality of charge amount thresholds, is also developed.

In such semiconductor memories, the charges are discharged with the elapse of time. Accordingly, upon the discharge of the charges in an amount beyond the threshold, an error occurs in reading information. In particular, multivalued memories are generally narrow in threshold intervals and thus are highly likely to cause errors.

An error correcting mechanism for correct restoration of erroneous information is provided in some storage devices using the semiconductor memory (see, for example, JP-A 2007-87464 (KOKAI)).

The error correcting mechanism, however, cannot properly correct an error when the error is beyond the error correcting capability. When the error correcting mechanism corrects the error without the recognition that the error is beyond the error correcting capability, a further error is disadvantageously added.

BRIEF SUMMARY OF THE INVENTION

An error correcting device according to an embodiment of the present invention is for correcting erroneous data included in data read out from a nonvolatile memory. The error correcting device includes a determining unit that determines whether the data read out from the nonvolatile memory include an error beyond an error correcting capability of the error correcting device. When the determining unit has determined that an error beyond the error correcting capability exists, the error correcting device does not perform the correction of the error.

An error correcting device according to an embodiment of the present invention is for correcting erroneous data included in data read out from a nonvolatile memory. The error correcting method includes determining whether the data read out from the nonvolatile memory includes an error beyond an error correcting capability. When it is determined that the data includes the error beyond the error correcting capability, the error is not corrected.

BRIEF DESCRIPTION OF THE DRAWINGS

FIG. 9A is a diagram showing the configuration of a ×α-circuit (a circuit for multiplication by a factor of α);

FIG. 9B is a diagram showing the configuration of a ×α^32-circuit (a circuit for multiplication by a factor of α^32);

FIG. 9C is a diagram showing the configuration of a ×α^111-circuit (a circuit for multiplication by a factor of α^111);

FIG. 9D is a diagram showing the configuration of a ×α^2-circuit (a circuit for multiplication by a factor of α^2);

FIG. 9E is a diagram showing the configuration of a ×α^64-circuit (a circuit for multiplication by a factor of α^6);

FIG. 9F is a diagram showing the configuration of a ×α^222-circuit (a circuit for multiplication by a factor of α^222);

DETAILED DESCRIPTION OF THE INVENTION

Figure 1:
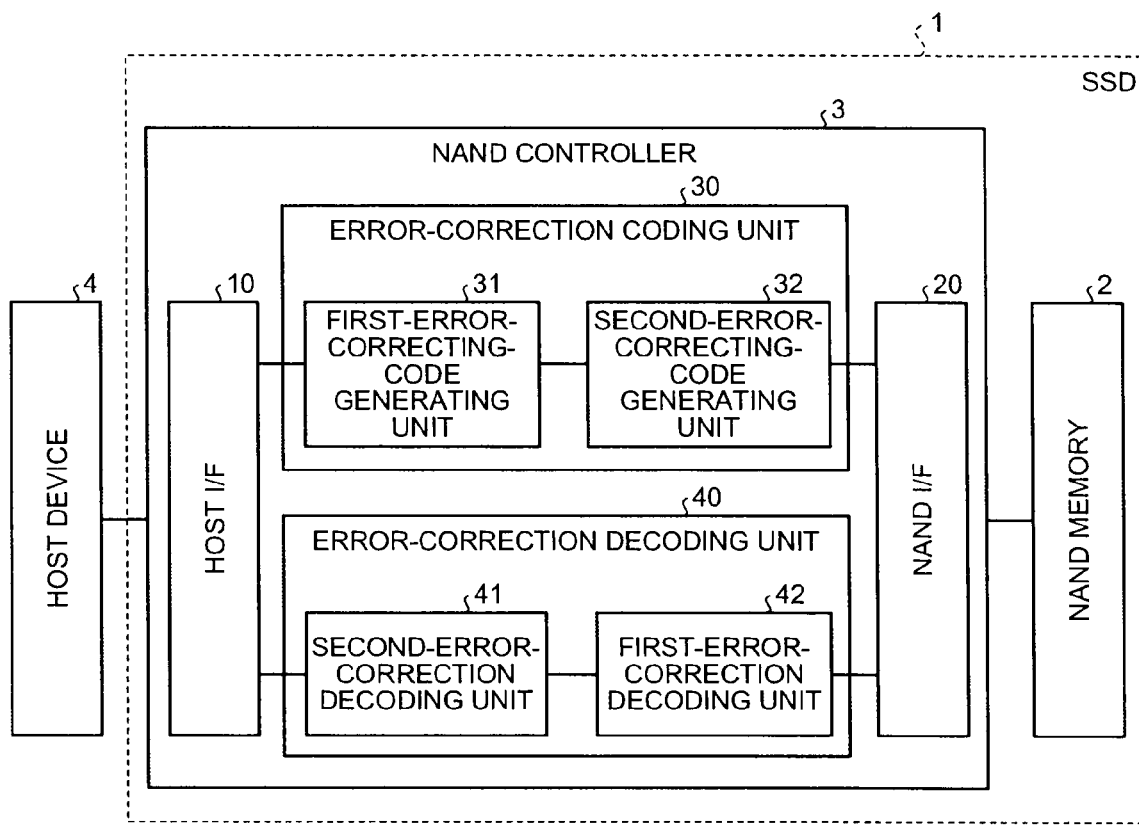
FIG. 1 is a block diagram showing an example of the configuration of a solid state drive (SSD)

The error correcting device and the error correcting method according to a first embodiment of the present invention will be explained with reference to FIGS. 1 to 11. FIG. 1 is a schematic block diagram showing an example of the configuration of a solid state drive (SSD) 1 according to the first embodiment of the present invention. SSD 1 is connected to a host device (a host) 4 through an interface (I/F) and functions as an external memory for the host device 4.

SSD 1 includes a NAND flash memory (hereinafter abbreviated to "NAND memory") 2 as a nonvolatile memory and a NAND controller 3 that performs reading of data from the NAND memory 2 and writing of data in the NAND memory 2 in response to an instruction by the host device 4. In this embodiment, a NAND memory is used as the nonvolatile memory. However, any storage device may be used so far as the nonvolatile memory has a feature that information data can be stored in a nonvolatile state and the stored data may undergo a change with the elapse of time.

Figure 2:
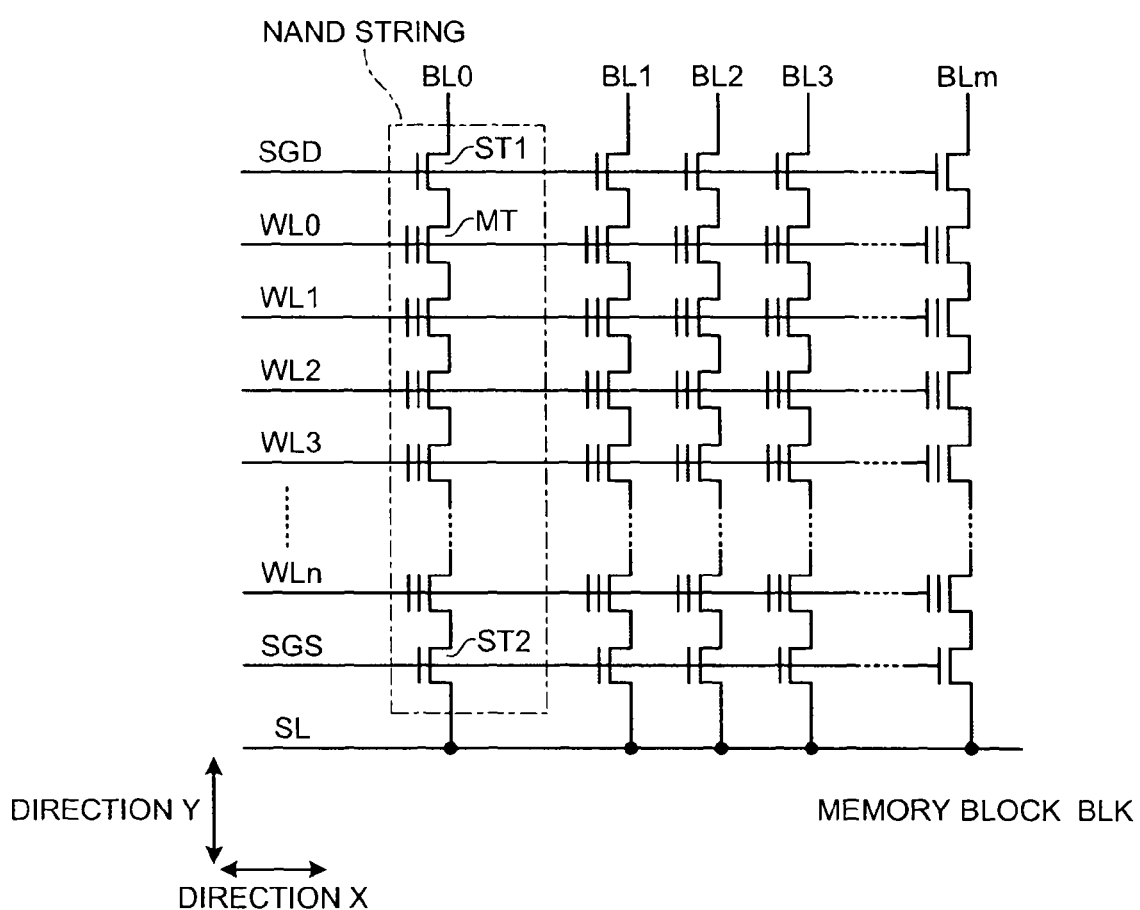
FIG. 2 is a circuit diagram showing an example of the configuration of one block included in a not-AND (NAND) memory chip.

The NAND memory 2 includes a plurality of memory blocks BLK as a data erasing unit. The configuration of the memory blocks BLK will be explained with reference to FIG. 2. FIG. 2 is an equivalent circuit diagram showing the configuration of any one of the memory blocks BLK.

The memory block BLK includes m NAND strings, wherein m is an integer of one or more, disposed along direction X. Each of the NAND strings includes selective transistors ST1, ST2 and n memory cell transistors MT wherein n is an integer of one or more. In the selective transistors ST1 included in the respective m NAND strings, drains are connected to respective bit lines BL1 to BLm, and gates are connected by common connection to a selective gate line SGD. On the other hand, in the selective transistors ST2, sources are connected by common connection to a source line SL, and gates are connected by common connection to a selective gate line SGS.

Each memory cell transistor MT is a metal oxide semiconductor field effect transistor (MOSFET) having a stacked gate structure provided on a semiconductor substrate through a gate insulating film. The stacked gate structure includes a charge accumulating layer (a floating gate electrode) provided on the gate insulating film and a control gate electrode provided on the charge accumulating layer through an intergate insulating film. In each of the NAND strings, n memory cell transistors MT are disposed between the source in the selective transistors ST1 and the drain in the selective transistors ST2 so that current paths are connected to each other in series. That is, the n memory cell transistors MT are connected to each other in series in direction Y so that a source region or a drain region is shared by adjacent memory cell transistors MT.

The control gate electrodes in the respective memory cell transistors MT are connected respectively to word lines WL1 to WLn successively from the memory cell transistor MT located nearmost to the drain side. Accordingly, the drain of the memory cell transistor MT connected to the word line WL1 is connected to the source of the selective transistor ST1, and the source of the memory cell transistor MT connected to the word line WLn is connected to the drain of the selective transistor ST2.

In the memory block BLK, the control gate electrodes of the respective memory cell transistors MT in the respective NAND strings are connected to each other through the respective common word lines WL1 to WLn. That is, the control gate electrodes of the memory cell transistors MT located in an identical row within the memory block BLK are connected to an identical word line WL. A plurality of memory cells connected to the identical word line WL are handled as one page, and data writing and data reading are performed page by page.

The drains of the selective transistors ST1 in the respective memory blocks BLK are connected to each other through the common respective bit lines BL1 to BLn. That is, the NAND strings located in an identical column within a plurality of memory blocks BLK are connected to an identical bit line BL.

The memory cell transistors MT undergo a change in threshold voltage depending upon the number of electrons stored in the floating gate electrode and store information depending upon the difference in threshold voltage. The memory cell transistor MT may be configured so as to store information of one bit, or alternatively may be configured so as to store a plurality of bits (multiple value). The embodiment according to the present invention is particularly effective for multivalued memory cell transistors MT with narrow threshold intervals. A sense amplifier and a control circuit (not shown), including a potential generating circuit, provided within the NAND memory 2 can write data, supplied into the NAND memory 2, in the memory cell transistors MT and can output data stored in the memory cell transistors MT to the outside of the NAND memory 2.

In FIG. 1, the NAND controller 3 includes host I/F 10 that performs interface processing with the host device 4, NAND I/F 20 that performs interface processing with the NAND memory 2 and controls reading/writing of data, an error-correction coding unit 30 that generates an error correcting code for data written in the NAND memory 2, and an error-correction decoding unit 40 that detects and corrects an error in data read out from the NAND memory 2. The error-correction coding unit 30 includes a first-error-correcting-code generating unit 31 and a second-error-correcting-code generating unit 32. The first-error-correcting-code generating unit 31 generates a first error correcting code for correcting the error on a predetermined block BK basis for the written data. Here the first error correcting code may be an error correcting code that can correct an error of one bit or a plurality of bits. In this embodiment, a hamming code (first error correcting code) of six bits having a 1-bit error correcting capability is generated on a basis of a block BK of 32-bit data.

The second-error-correcting-code generating unit 32 generates, on a basis of a plurality of blocks, a second error correcting code for the data written in the NAND memory 2 for error correction of the data. The second error correcting code may be an error correcting code that can correct an error of a plurality of bits. Examples of such error correcting codes usable herein include Bose-Chaudhuri-Hocquenghem codes (BCH codes) and Reed-Solomon codes (RS codes). In this embodiment, a BCH code of 16 bits having a two-bit error correcting capability is generated on a four-block (128 bits) basis.

Figure 3:
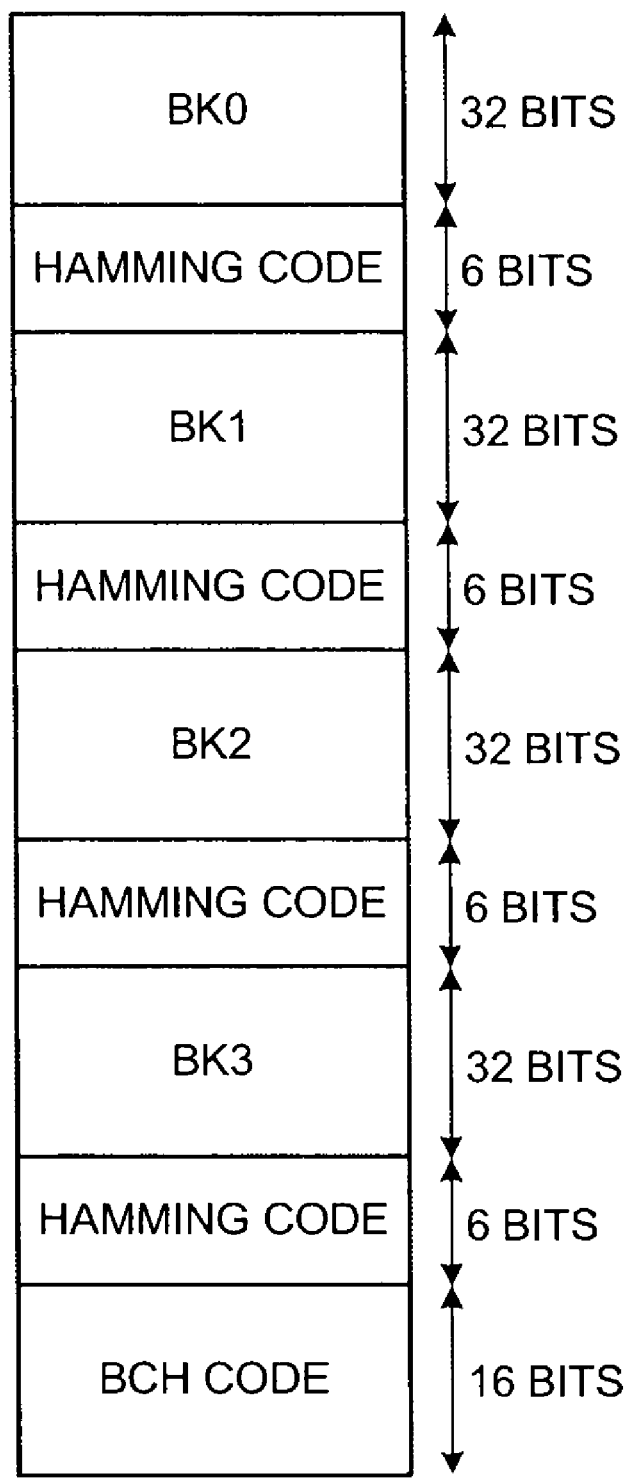
FIG. 3 is a diagram showing an example of the configuration of data written in a NAND memory.

FIG. 3 is a diagram showing an example of the configuration of data written in the NAND memory 2. As shown in the drawing, a six-bit hamming code (first error correcting code) having a 1-bit error correcting capability is added on a basis of a block BK of 32-bit data, and a 16-bit BCH code (second error correcting code) having a 2-bit error correcting capability is added on a four-block BK (128 bits) basis.

The error-correction decoding unit 40 includes a first-error-correction decoding unit 42 and a second-error-correction decoding unit 41. The first-error-correction decoding unit 42 performs first error correction for the data read out from the NAND memory 2 using the hamming code on a block BK basis. The first-error-correction decoding unit 42 further detects an error from the data after the first error correction and outputs the results of error correction to the second-error-correction decoding unit 41. The second-error-correction decoding unit 41 refers to the results of error correction and performs second error correction for the data after the first error correction using the BCH code on a four-block BK basis.

The operation of SSD 1 having the above configuration will be briefly explained. Upon the supply of data (write data), which require writing, from the host device 4 into SSD 1, the host I/F 10 supplies the received write data into the error-correction coding unit 30. The error-correction coding unit 30 generates a first and a second error correcting codes for the write data. NAND I/F 20 writes the write data with the first and the second error correcting codes added thereto in the NAND memory 2.

Further, upon the receipt of a request for reading-out of data from the host device 4 by SSD 1, NAND I/F 20 reads out data required to be read out (reading-out data) and the first and the second error correcting codes added to the data and supplies them to the error-correction decoding unit 40. The error-correction decoding unit 40 performs the first and the second error correction of the read-out data. The data after error correction are transferred by the host I/F 10 to the host device 4.

Figures 4A, 4B:
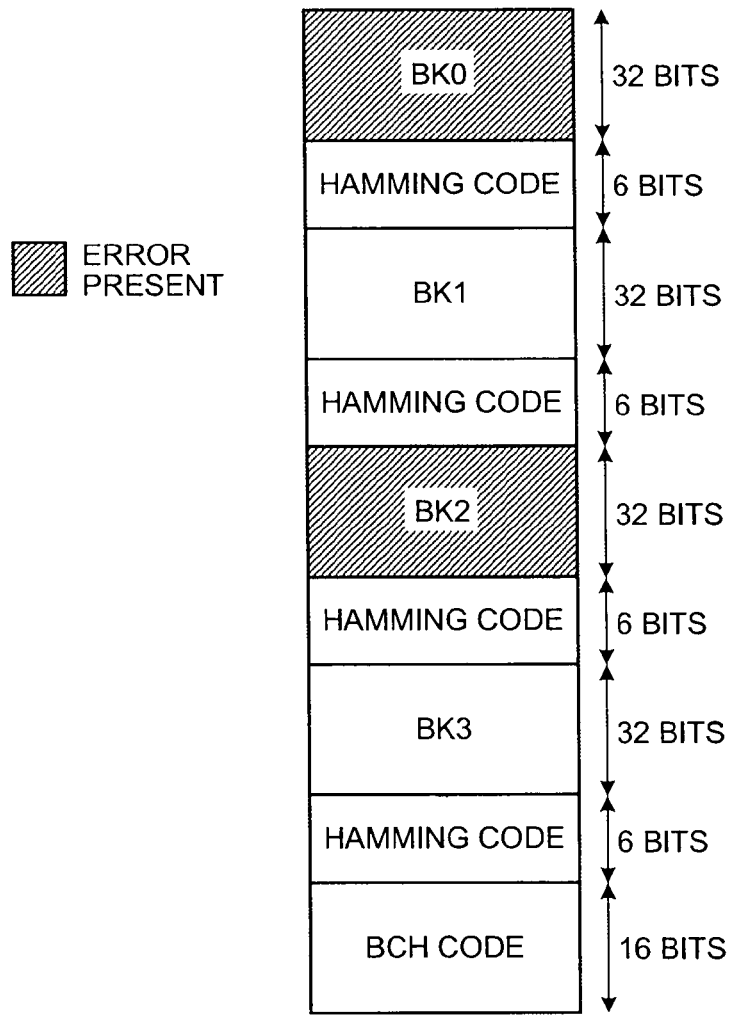
FIG. 4A is a diagram showing an example of the results of first error correction of the data shown in FIG. 3.
FIG. 4B is a diagram showing an example of the results of the processing of the first error correction.
Figure 5:
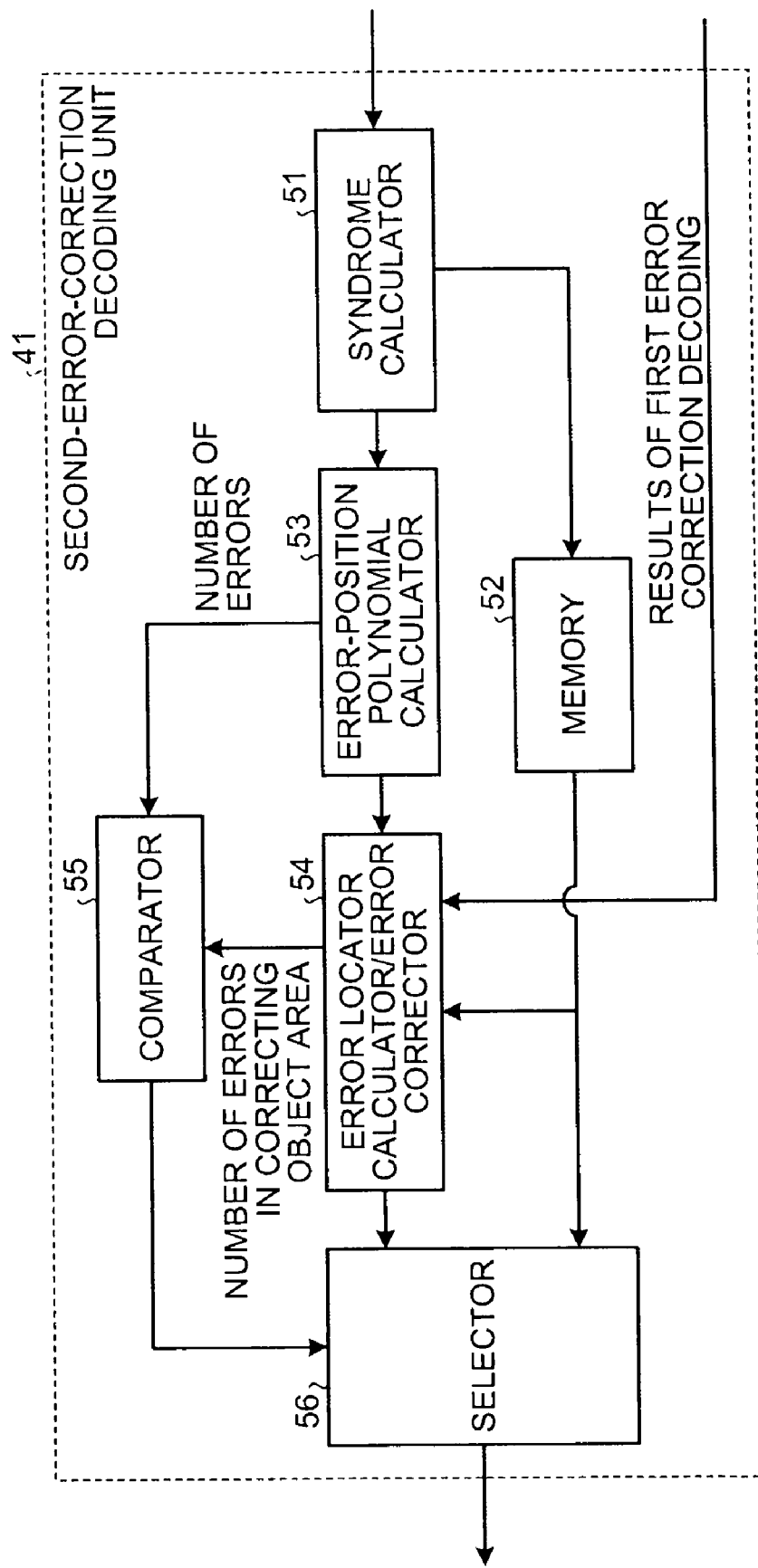
FIG. 5 is a diagram showing an example of the configuration of a second-error-correction decoding unit.
Figure 6:
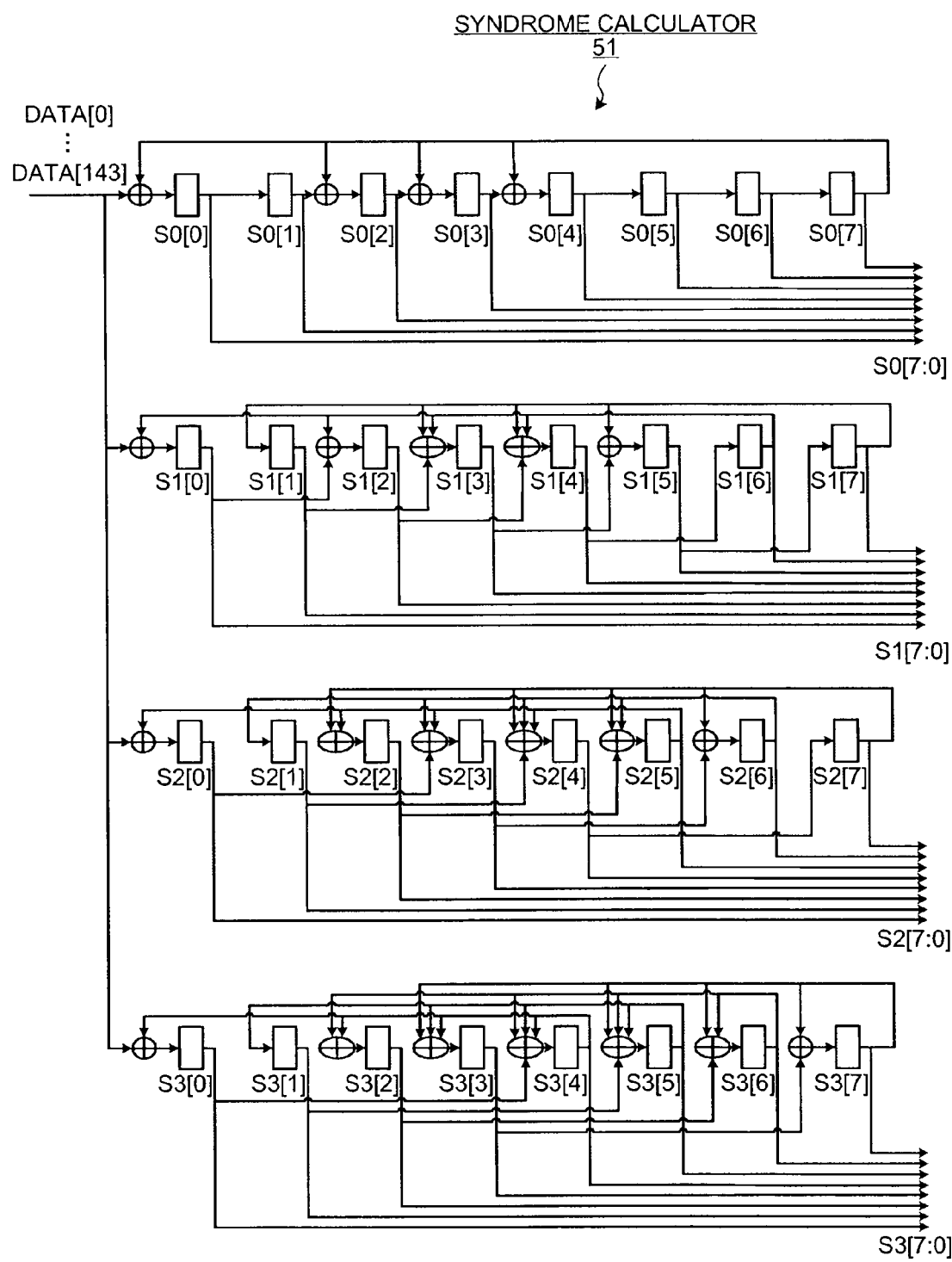
FIG. 6 is a diagram showing an example of the configuration of a circuit of a syndrome calculator.

The configuration and operation of the second-error-correction decoding unit 41 will be explained in detail with reference to FIGS. 4 to 11. FIG. 4A is a diagram showing an example of the configuration of data after first error correction, and FIG. 4B is a diagram showing an example of the results of first error correction processing. FIG. 5 is a diagram showing an example of the configuration of the second-error-correction decoding unit 41. FIG. 5 is a flow diagram that briefly explains processing in the second correction decoding unit. FIG. 6 is a diagram showing an example of the configuration of a circuit of a syndrome calculator.

As shown in FIG. 5, the second-error-correction decoding unit 41 includes a syndrome calculator 51 that calculates a syndrome value of the reading-out data subjected to the first error correction, a memory 52 for temporarily storing the data, an error-position polynomial calculator 53 that generates an error position polynomial based on the syndrome value, an error locator calculator/error corrector 54 that computes the root of the error position polynomial, identifies the position of the error, corrects the data located in the error position, and calculates the number of errors in a data correcting object area, a comparator 55 that compares the number of errors, calculated by the error-position polynomial calculator 53, with the number of errors calculated by the error locator calculator/error corrector 54, and a selector 56 that selects the data after the error correction with the error locator calculator/error corrector 54 and the data before the error correction stored in the memory 52.

It has been found that, when a correctable error of data exists, the probability that the error position indicated by the error locator calculator/error corrector 54 is correct is high, while, when an error beyond the error correcting capability exists, the probability that the error position indicated by the error locator calculator/error corrector 54 is erroneous is high. Based on this finding, in this embodiment, the following method is adopted. The number of errors in the correcting object area is compared with the number of errors determined by the calculation of the error position polynomial. When the number of errors in the correcting object area is not equal to the number of errors determined by the calculation, the error is determined to be beyond the error correcting capability. That is, the error is determined to be uncorrectable. In this case, the error correction is not performed.

The error-position polynomial calculator 53 calculates the error position polynomial using a syndrome polynomial and outputs a coefficient of the error position polynomial to the error locator calculator/error corrector 54. Further, the error-position polynomial calculator 53 calculates the number of errors from the error position polynomial and outputs the results to the comparator 55.

When the number of errors included in the data exceeds the error correcting capability (n bits), the number of errors, which is different from the actual number of errors, is sometimes calculated. For example, when a BCH code having an error correcting capability of 10 bits is used, an error of 30 bits is sometimes calculated as an error of 10 bits.

The error locator calculator/error corrector 54 performs a Chien search using the coefficient of error position polynomial received from the error-position polynomial calculator 53, calculates the position of the error in the correcting object area, counts the number of errors in the object area, reads out the data before the correction stored in the memory 52, and corrects the error. The error locator calculator/error corrector 54 outputs the error corrected data to the selector 56 and further outputs the counted number of errors in the correcting object area to the comparator 55.

The comparator 55 compares the number of errors received from the error-position polynomial calculator 53 with the number of errors in the object area received from the error locator calculator/error corrector 54. When the number of errors received from the error-position polynomial calculator 53 is equal to the number of errors received from the error locator calculator/error corrector 54, the comparator 55 outputs normal information indicating that the results of the error correction are correct (for example, "1") to the selector 56. On the other hand, when the number of errors received from the error-position polynomial calculator 53 is not equal to the number of errors received from the error locator calculator/error corrector 54, the comparator 55 determines that an error beyond the error correcting capability exists. In this case, the comparator 55 outputs abnormal information indicating that the results of error correction are abnormal (for example, "0") to the selector 56.

Upon the receipt of a normal signal from the comparator 55, the selector 56 transfers the error corrected data received from the error locator calculator/error corrector 54 to the host device 4. On the other hand, upon the receipt of an abnormal signal from the comparator 55, the selector 56 transfers the data before the error correction stored in the memory 52 to the host device 4.

The operation of error correction decoding in the first and the second-error-correction decoding units 42 and 41 will be explained in detail. When the host device 4 sends a request for reading-out of data to the NAND memory 2, NAND I/F 20 reads out the requested data from the NAND memory 2 and outputs the data to the first-error-correction decoding unit 42.

The first-error-correction decoding unit 42 receives the data (data block, hamming code, and BCH code) read out from the NAND memory 2 and performs first error correction using the hamming code for each block BK. In this embodiment, the hamming code has a 1-bit error correcting capability, and, thus, an error of two bits or more cannot be corrected. The first-error-correction decoding unit 42 detects whether the error of the block BK could be corrected by the first error correction processing. Specifically, for example, a method may be adopted in which, for the block BK after the first error correction, the syndrome calculation is carried out and whether the error could be corrected is determined based on the calculation results ("0"=no error). Alternatively, a method may be adopted in which an error detecting code is added for each block BK and whether the data after the first error correction include an error is detected using the error detecting code.

The first-error-correction decoding unit 42 discards the hamming codes and outputs, to the second-error-correction decoding unit 41, the data blocks BK after the first error correction processing, the BCH code, and the results (results of first error correction decoding) of the first error correction processing for each of the data blocks BK. Processing where an error exists in BK0 and BK2 among the read-out data after the first error correction as shown in FIG. 4A will be explained below. FIG. 4B is a diagram showing the results of the first error processing shown in FIG. 4A (one bit). In the drawing, "0" represents that an error is absent while "1" represents that an error exists.

In the second-error-correction decoding unit 41, the blocks BK after the first error correction processing, the BCH code, and the results of the first error correction for each of the data blocks BK (one bit) are stored in the memory 52, and, further, the blocks BK after the first error correction processing and BCH code are input into the syndrome calculator 50. Processing where, in performing BCH coding in the second-error-correcting-code generating unit 32, a primitive polynomial G(X) represented by the following equation (1) is used, will be explained.

$$\text{Primitive polynomial: } G(X)=x^8+x^4+x^3+x^2+1 \quad (1)$$

In the syndrome calculator 51, as shown in FIG. 6, data are input in the order of data[0] to data[143] in BK0, BK1, BK2, BK3, and BCH code followed by syndrome calculation. The results of the syndrome calculation S0[7:0] to S3[7:0] are output to the error-position polynomial calculator 53.

In FIG. 5, the error-position polynomial calculator 53 calculates coefficients σ1 and σ2 using the results of syndrome calculation S0[7:0] to S3[7:0] in error position polynomial σ(Z)=1+σ0Z+σ1Z^2. This processing will be explained using Peterson's algorithm. Other methods usable herein include Berlekamp-Massey algorithm (BM algorithm) and Euclidean algorithm. In the Peterson's algorithm, a determinant represented by the following equation (2) is computed using values S0 to S3 obtained by syndrome calculation to calculate the coefficients σ0 and σ1 of the error position polynomial. The coefficients σ0[7:0] and σ1[7:0] of the error position polynomial calculated by the error-position polynomial calculator 53 are output to the error locator calculator/error corrector 54.

$$\begin{pmatrix} S1 & S0 \\ S2 & S1 \end{pmatrix} \begin{pmatrix} \sigma 0 \\ \sigma 1 \end{pmatrix} = -\begin{pmatrix} S2 \\ S3 \end{pmatrix} \quad (2)$$

The error locator calculator/error corrector 54 performs a Chien search based on the coefficients σ0[7:0] and σ1[7:0] of the error position polynomial received from the error-position polynomial calculator 53 to identify the position of an error and performs the second error correction of the data subjected to the first error correction stored in the memory 52.

Figure 7A:
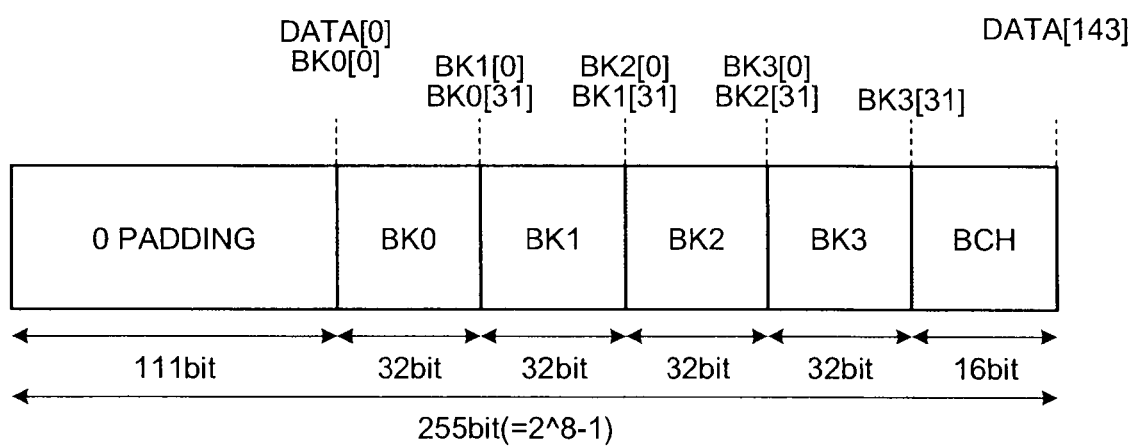
FIG. 7A is a diagram showing the configuration of data for second error correction processing.
Figure 7B:
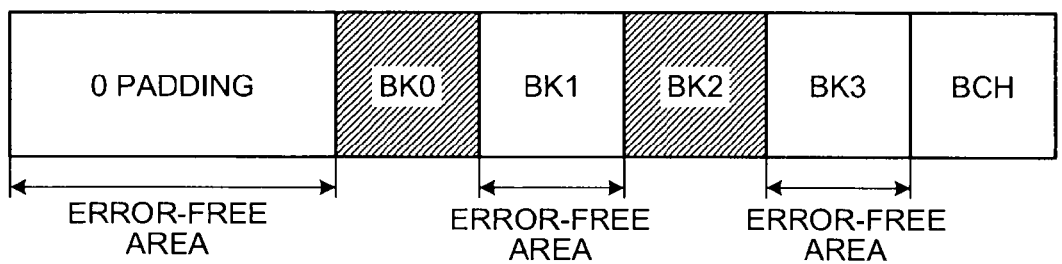
FIG. 7B is a diagram showing an embodiment of the second error correction processing of the data shown in FIG. 7A.

To bring the code length to 2^N−1=255 bits (fixed length) wherein N=8, as shown in FIG. 7A, the error locator calculator/error corrector 54 performs zero padding of leading 111 bits in data as a processing object. In the case of FIG. 4A, as shown in FIG. 7B, the padding area and the blocks BK1 and BK3 detected as error-free blocks constitute an error-free area. In this embodiment, the error locator calculator/error corrector 54 counts the number of errors at a high speed by skipping error counting processing of an area in a range of from the lead to the error-free area (padding area and the area determined to be free from an error after the first error correction) and counting the number of errors only in the other areas.

Figure 8:
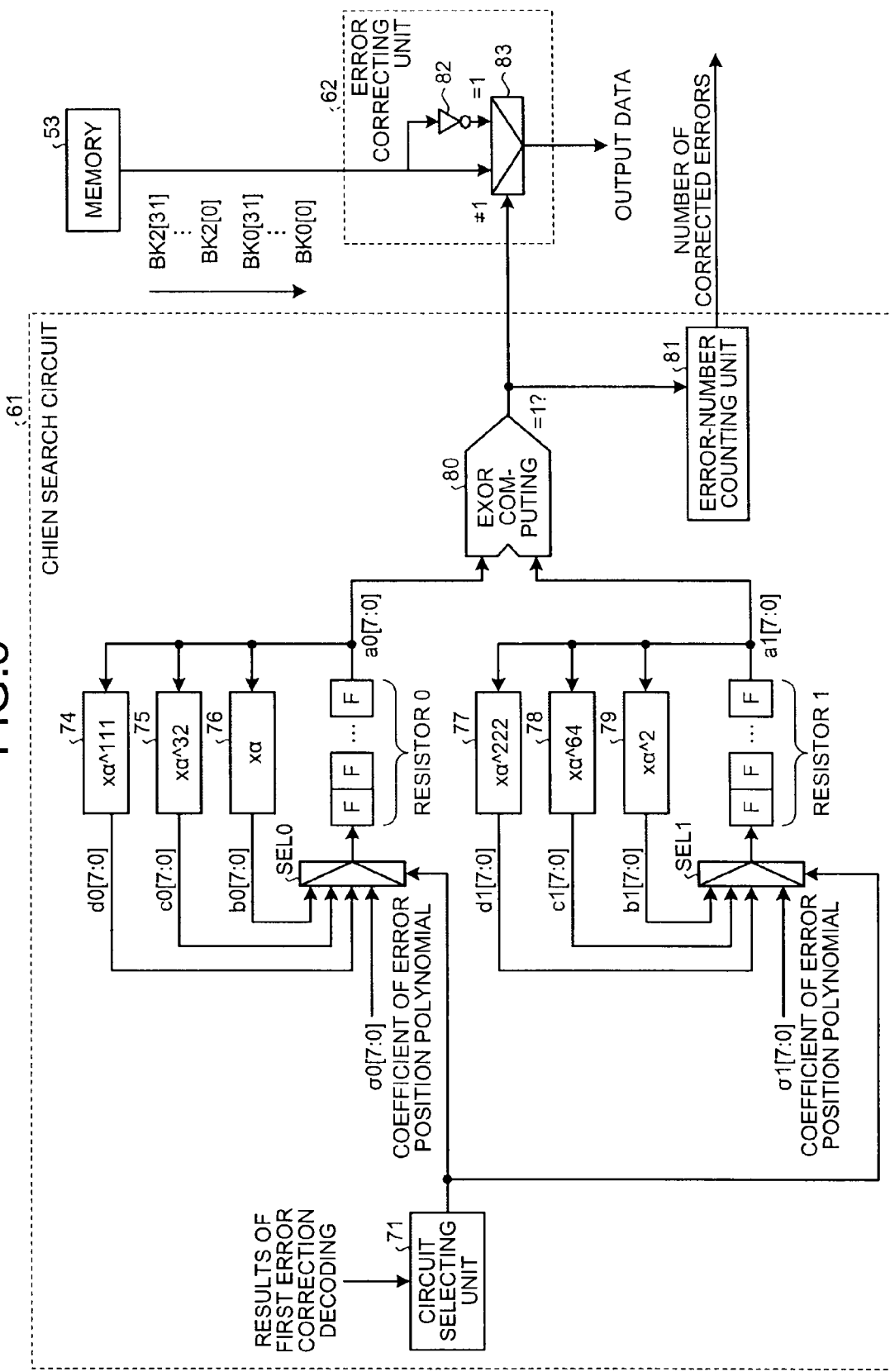
FIG. 8 is a diagram showing an example of the configuration of a Chien search circuit and an error correcting unit in an error locator calculator/error corrector.
Figure 10:
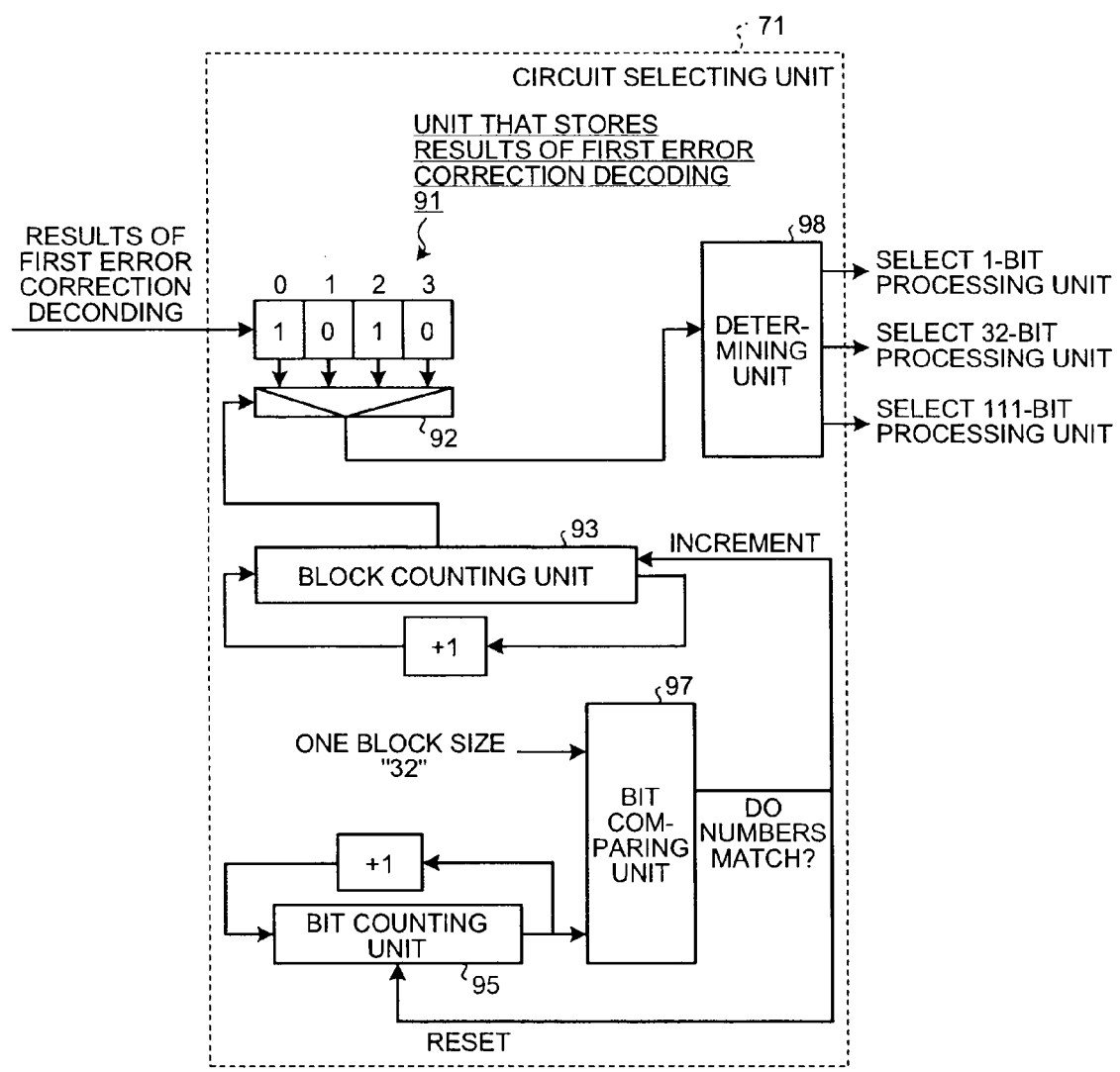
FIG. 10 is a diagram showing an example of the configuration of a circuit selecting unit.

FIG. 8 is a diagram showing an example of the configuration of a Chien search circuit 61 and an error correcting unit 62 in the error locator calculator/error corrector 54. FIG. 9A is a diagram showing the configuration of a ×α-circuit (a circuit for multiplication by a factor of α) in the Chien search circuit 61 (multiplication circuit). FIG. 9B is a diagram showing the configuration of a ×α^32-circuit (a circuit for multiplication by a factor of α^32) in the Chien search circuit 61. FIG. 9C is a diagram showing the configuration of a ×α^111-circuit (a circuit for multiplication by a factor of α^111) in the Chien search circuit 61. FIG. 9D is a diagram showing the configuration of a ×α^2-circuit (a circuit for multiplication by a factor of α^2) in the Chien search circuit 61. FIG. 9E is a diagram showing the configuration of a ×α^64-circuit (a circuit for multiplication by a factor of α^64) in the Chien search circuit 61. FIG. 9F is a diagram showing the configuration of a ×α^222-circuit (a circuit for multiplication by a factor of α^222) in the Chien search circuit 61. FIG. 10 is a diagram showing the configuration of a circuit selecting unit in the Chien search circuit.

The Chien search algorithm is an algorithm in which the αith power of algorithm α, where i=0, 1, . . . , n−1, is iteratively substituted for σ(z) to examine whether σ(αi) is zero (0). The search for the root by this algorithm is called a Chien search.

As shown in FIG. 8, the Chien search circuit 61 includes a circuit selecting unit 71 that outputs a switching signal to selectors SEL0, SEL 1, a selector SEL0 that alternatively selects and outputs the output of a ×α-circuit 76, a ×α^32-circuit 75, and a ×α^111-circuit 74, a selector SEL1 that alternatively selects and outputs the output of a ×α^2-circuit 79, a ×α^64-circuit 78, and a ×α222-circuit 77, registers 0, 1, an EXOR computing circuit 80, and an error-number counting unit 81 that counts the number of times which brings the output of the EXOR computing circuit 80 to "1" and outputs the count as the number of errors to the comparator 55 (see FIG. 5).

The Chien search circuit 61 further includes 1-bit processing units (×α-circuit 76 and ×α^2-circuit 79), 32-bit processing units (×α^32-circuit 75 and ×α^64-circuit 78), and 111-bit processing units (×α^111-circuit 74 and ×α^222-circuit 77) as multipliers that feed back a resistor output to a register input.

The provision of the 32-bit processing units (×α^32-circuit 75 and ×α^64-circuit 78) and 111-bit processing units (×α^111-circuit 74 and ×α^222-circuit 77) in addition to the 1-bit processing units (×α-circuit 76 and ×α^-circuit 79) in the Chien search circuit 61 according to this embodiment can accelerate the Chien search.

The 1-bit processing units (×α-circuit 76 and ×α^2-circuit 79) are used when the blocks in the error correcting object area are processed on a 1-bit basis. The 32-bit processing units (×α^32-circuit 75 and ×α^64-circuit 78) are used when a block (32 bits), which has been determined to be free from an error in an area which is not the error correcting object area, is processed. The 32-bit processing units can process the 32-bit data by one cycle (at one time). The 111-bit processing units (×α^111-circuit 74 and ×α^222-circuit 77) are used when a padding area (111 bits) subjected to zero padding in an area, which is not the error correcting object area, is processed. The 111-bit processing units can process the 111-bit data by one cycle (at one time).

The error correcting unit 62 includes an inverter 82 that inverts and outputs data, and a selector 83 that outputs an inverted value of input data when the results of the EXOR computation are "1" while the input data as such are output when the results of the EXOR computation are a value other than "1".

Processing flow of the Chien search circuit 61 will be explained. At the outset, the coefficients σ0[7:0] and σ1[7:0] determined by the error position polynomial calculation are introduced into a register 0 and a register 1.

(1) The processing is transferred to processing of the zero padding area located in the lead. Since this area has been determined to be free from an error, the circuit selecting unit 71 outputs, to SEL0 and SEL1, a selection signal that allows the selection of the ×α^111-circuit and the ×α^222-circuit. The selectors SEL0 and SEL1 select an output of the ×α^111-circuit 74, i.e., d0[7:0], and an output of the ×α^222-circuit 77, i.e., d1[7:0], respectively, which are then introduced into the resistor 0 and the resistor 1, respectively. This can realize the processing of the 0 padding area (111 bits) by one cycle (at one time) and thus can accelerate the processing of the 0 padding area (111 bits).

(2) Block BK0 is processed. The block BK0 is an error correcting object block BK. At the outset, the error correcting unit 62 retrieves the leading data BK0[0] in the block BK0 from the memory 53. Next, an output of the ×α-circuit 76, i.e., b0[7:0], and an output of the ×α^2-circuit 79, i.e., b1[7:0], are selected and are introduced into the resistor 0 and the resistor 1. A selector 92 in the error correcting unit 62 outputs an inverted value of the value of BK0[0] when the results of EXOR computation performed in the EXOR computing unit 80 in the resistor 0 and the resistor 1 are "1". When the results of the EXOR computation are a value other than 1, the value of BK0[0] as such is output. Next, the error correcting unit 62 retrieves the second data BK0[1] in the block BK0 from the memory 53. An output of the ×α-circuit 76, i.e., b0[7:0], and an output of the ×α^2-circuit 79, i.e., b1[7:0], are selected and are introduced into the resistor 0 and the resistor 1. When the results of the EXOR computation in the resistor 0 and the resistor 1 are 1, an inverted value of the value of BK0[1] is output. When the results of the EXOR computation are a value other than 1, the value of BK0[1] as such is output. The same procedure is repeated to the last data BK0[31] in the block BK0. Thus, BK0 is processed on a 1-bit basis.

(3) The block BK1 is processed. The block BK1 is a block other than the error correcting object. Accordingly, an output of the ×α^32-circuit 75, i.e., c0[7:0], and an output of the ×α^64-circuit 78, i.e., c1[7:0], are introduced into the resistor 0 and the resistor 1. This can realize the processing of the block (32 bits) other than the error correcting object at one time and thus can accelerate the processing of the block (32 bits) other than the error correcting object.

(4) The block BK2 is processed. The block BK2 is an error correcting object block. In the same manner as in the processing (3), data from the leading data BK2[0] to the last data BK2[31] in the block BK2 are retrieved from the memory 53 and are processed.

(5) The block BK3 is processed. The block BK3 is a block other than the error correcting object. An output of the ×α^32-circuit 75, i.e., c0[7:0], and an output of the ×α^64-circuit 78, i.e., c1[7:0], are introduced into the resistor 0 and the resistor 1.

FIG. 10 is a diagram showing an example of the configuration of the circuit selecting unit 71. The circuit selecting unit 71 includes a unit 91 that stores the results of first error correction decoding, a selector 92, a block counting unit 93, a bit counting unit 95, a bit comparing unit 97, and a determining unit 98.

The unit 91 that stores the results of first error correction decoding, stores the results of the first error correction decoding for each of the blocks BK0 to BK3. "0" represents an error corrected BK (a block other than the object block in the second error correction decoding). "1" represents an uncorrected BK (an object block in the second error correction decoding).

The bit counting unit 95 counts a value in a bit counter, which indicates a current processing position in one block BK, and outputs the count to the bit comparing unit 97 (value in bit counter=0 to 31). The block counting unit 93 counts a value in a block counter, which indicates a current processing block in four blocks BK, and outputs the count to the selector 92 (value in block counter=0 to 3). The bit comparing unit 97 determines whether the bit count is equal to the block size. When the bit count is equal to the block size, the bit comparing unit 97 allows the block counting unit 93 to increment the block count.

The selector 92 outputs, to the determining unit 98, the results of first error correction decoding, in the block indicated by the value in the block counter, stored in a unit 111 that stores the results of the first error correction decoding. Based on the results of the first error correction decoding in the current processing block output from the selector 92, the determining unit 98 selects any one of the 1-bit processing circuit (×α-circuit 76 and ×α^2-circuit 79), the 32-bit processing circuit (×α^32-circuit 75 and ×α^64-circuit 78), and the 111-bit processing circuit (×α^111-circuit 74 and ×α^222-circuit 77) and outputs a selection signal to the selectors SEL0, SEL1. Immediately after the start of the processing, the determining unit 98 selects the 111-bit processing unit (×α^111-circuit 74 and ×α^222-circuit 77) to process the padding area. When the current processing block is a block other than the correcting object block, the determining unit 98 selects the 32-bit processing unit (×α^32-circuit 75 and ×α^64-circuit 78). When the current processing block is an error correcting object block, the determining unit 98 selects the 1-bit processing unit (×α-circuit 76 and ×α^2-circuit 79).

Figure 11:
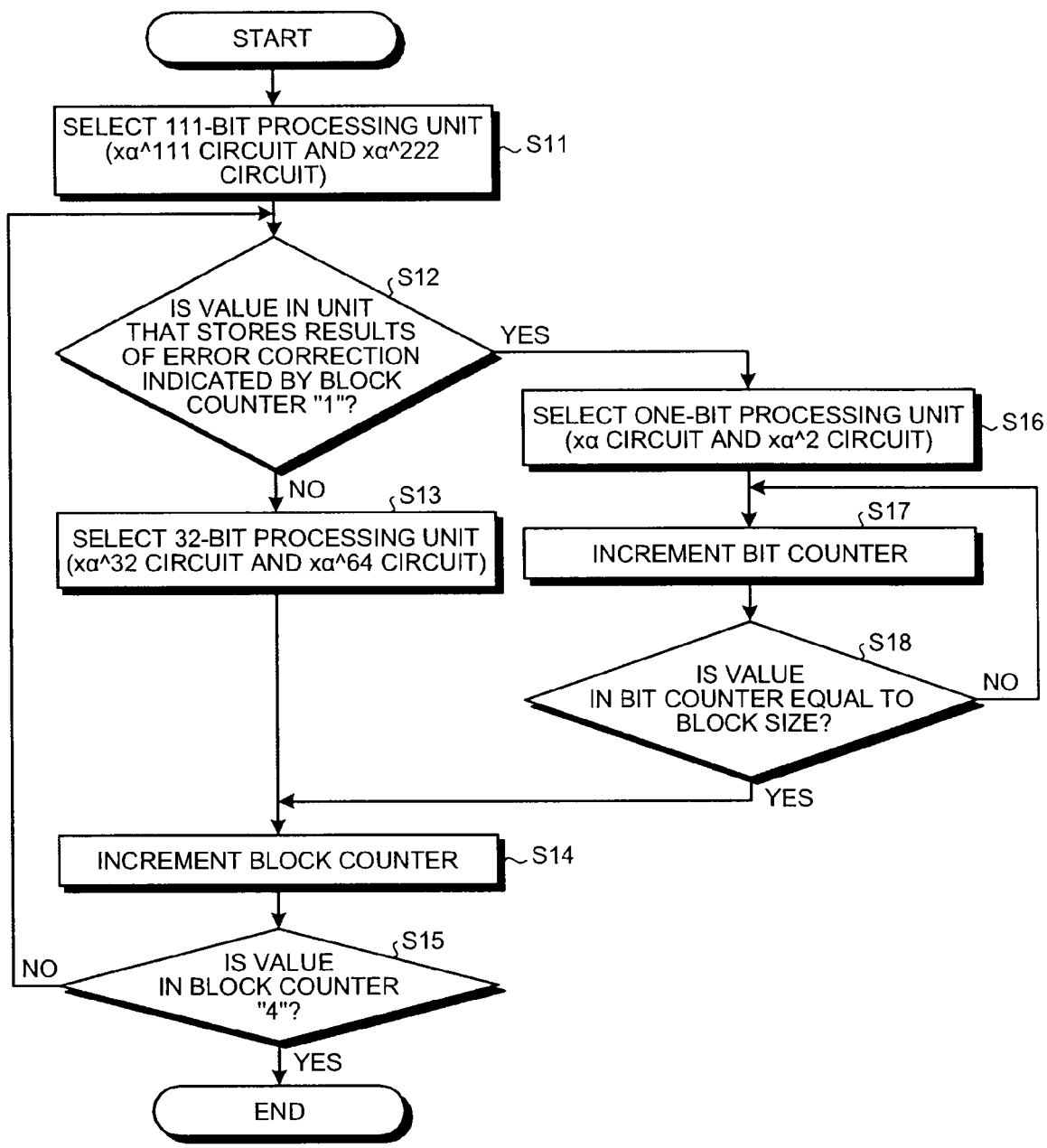
FIG. 11 is a diagram that explains the operation of a circuit selecting unit.

FIG. 11 is a flow chart that explains the operation of the circuit selecting unit 71. In FIG. 11, at the outset, the determining unit 98 selects the 111-bit processing unit (×α^111-circuit 74 and ×α^222-circuit 222) (step S11). Next, the determining unit 98 determines whether the value, in the unit 91 that stores the results of the first error correction decoding, indicated by the value in the block counter is "1" (step S12). When the value is "1" ("Yes" in step S12), the determining unit 98 selects the 1-bit processing unit (×α-circuit 76 and ×α^2-circuit 79) (step S16). The bit counting unit 95 increments the value in the bit counter (step S17), and the bit comparing unit 97 determines whether the value in the bit counter is equal to the block size "32" (step S18). When the value in the bit counter is equal to the block size ("Yes" in step S18), the step is transferred to step S14. On the other hand, when the value in the bit counter is not equal to the block size ("No" in step S18), the step is returned to step S17.

In step S12, when the value, in the unit 91 that stores the results of the first error correction decoding, indicated by the value in the block counter, is not "1" ("No" in step S12), the determining unit 98 selects the 32-bit processing unit (×α^32-circuit 75 and ×α^64-circuit 78) (step S13), and the block counting unit 95 increments the block counter (step S14). When the value in the block counter is "4" ("Yes" in step S15), the flow is ended. On the other hand, when the value in the block counter is not "4" ("No" in step S15), the step is returned to step S12.

As described above, according to the first embodiment, whether an error beyond an error correcting capability of second error correction exists is determined, and, when an error beyond the error correcting capability has been determined to exist, the second error correction is not performed. The addition of a further error in the presence of an error beyond the error correcting capability can be avoided.

Further, according to this embodiment, the comparator 55 compares the information about the number of errors received from the error-position polynomial calculator 53 with the information about the number of errors in the object area received from the error locator calculator/error corrector 54, and, when these numbers of errors are not equal to each other, an error beyond the error correcting capability has been determined to exist. Accordingly, whether an error beyond the error correcting capability exists can be determined in a simple and cost-effective manner.

The error locator calculator/error corrector 54 does not count the number of errors in the error-free area and counts the number of errors (the number of corrected errors) only in the other areas. Accordingly, the number of errors can be counted at a high speed.

The second-error-correction decoding unit 41 according to a second embodiment of the present invention will be explained with reference to FIGS. 12 to 15. It has been found that, when a correctable error of data exists, the probability that the error position indicated by the error locator calculator/error corrector 101 is correct is high, while, when an error beyond the error correcting capability exists, the probability that the error position indicated by the error locator calculator/error corrector 101 is erroneous is high. Based on this finding, according to the second embodiment, the following method is adopted. In FIG. 7B, in the error locator calculator/error corrector 101, the error position is detected from the lead. When an error position is found in the error-free area (area other than the correcting object area), the error is determined to be beyond the error correcting capability and is determined to be uncorrectable. In this case, subsequent detection of error position is not performed.

Figure 12:
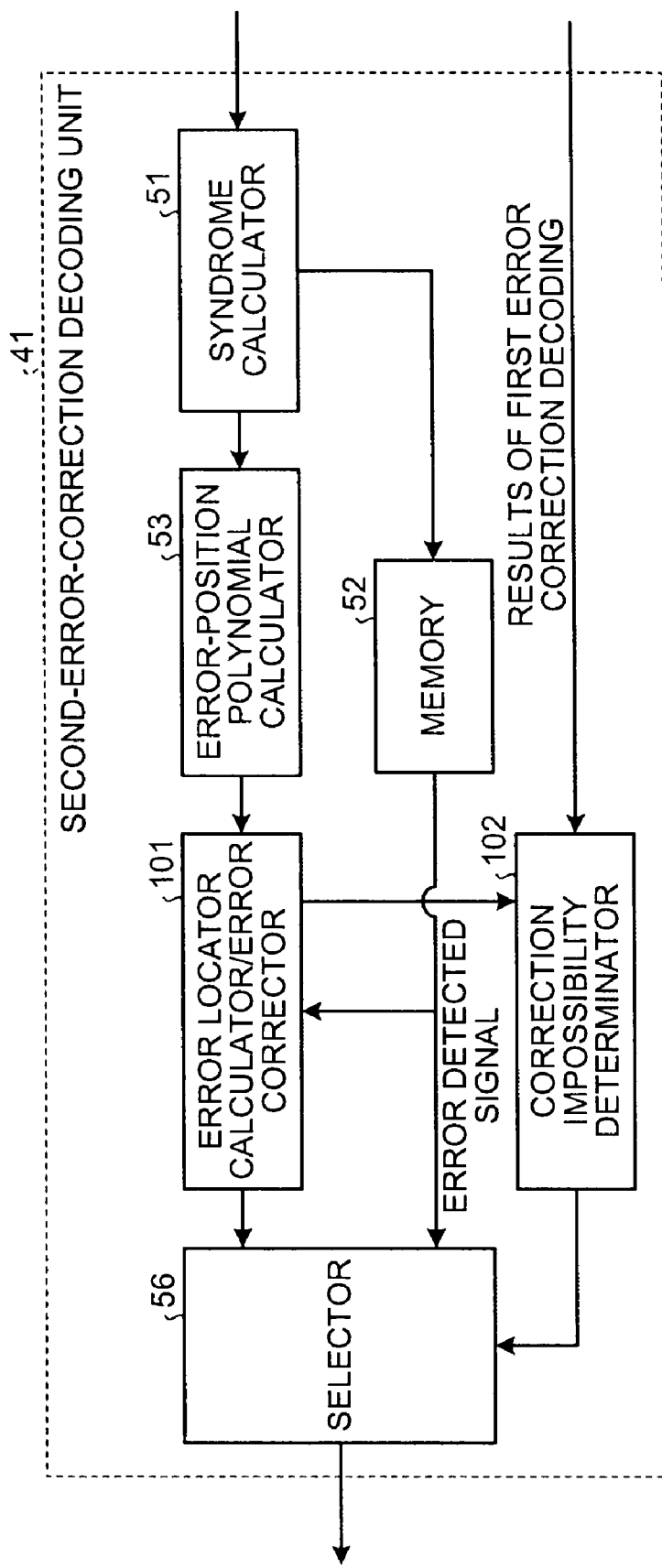
FIG. 12 is a diagram showing an example of the configuration of a second-error-correction decoding unit according to a second embodiment of the present invention.

FIG. 12 is a diagram showing the configuration of the second-error-correction decoding unit 41 according to the second embodiment. The second-error-correction decoding unit 41 according to the second embodiment includes a syndrome calculator 51 that performs syndrome calculation, a memory 52 that temporarily stores data, an error-position polynomial calculator 53, an error locator calculator/error corrector 101, a correction impossibility determinator 102, data after the second error correction, and a selector 56 that selects data before the second error correction stored in the memory 52.

The syndrome calculator 51 performs syndrome polynomial calculation and outputs the calculated syndrome polynomial to the error-position polynomial calculator 53. The error-position polynomial calculator 53 performs error position polynomial calculation using syndrome polynomial and outputs the coefficient of error position polynomial to the error locator calculator/error corrector 101.

The error locator calculator/error corrector 101 performs a Chien search using the coefficient of error position polynomial input from the error-position polynomial calculator 53 to calculate the error position, reads out data before the correction stored in the memory 52, corrects the error, and outputs the corrected data to the selector 56. Upon the detection of an error, the error locator calculator/error corrector 101 outputs an error detected signal to the correction impossibility determinator 102.

When the error detected area is determined to be an error-free area (padding area and area which has been determined to be free from an error by the error detection) based on the results of first error correction received from the first-error-correction decoding unit 42 and the error detected signal received from the error locator calculator/error corrector 101, the correction impossibility determinator 102 determines that the error is uncorrectable that is, is determined to be beyond the error correcting capability. In this case, the correction impossibility determinator 102 ends the processing and outputs an abnormal signal indicating that the error is uncorrectable to the selector 56.

The selector 56 transfers the data after the error correction received from the error locator calculator/error corrector 101 to the host device 4. On the other hand, when an abnormal signal is received from the correction impossibility determinator 102, the selector 56 transfers the data before the error correction stored in the memory 52 to the host device 4.

To bring the code length to $2^N-1=255$ bits (fixed length) wherein N=8, as shown in FIG. 7A, the error locator calculator/error corrector 101 performs zero padding of leading 111 bits in data as a processing object. In the case of FIG. 4A, as shown in FIG. 7B, the padding area and the blocks BK1 and BK3 detected as error-free blocks constitute an error-free area.

Figure 13:
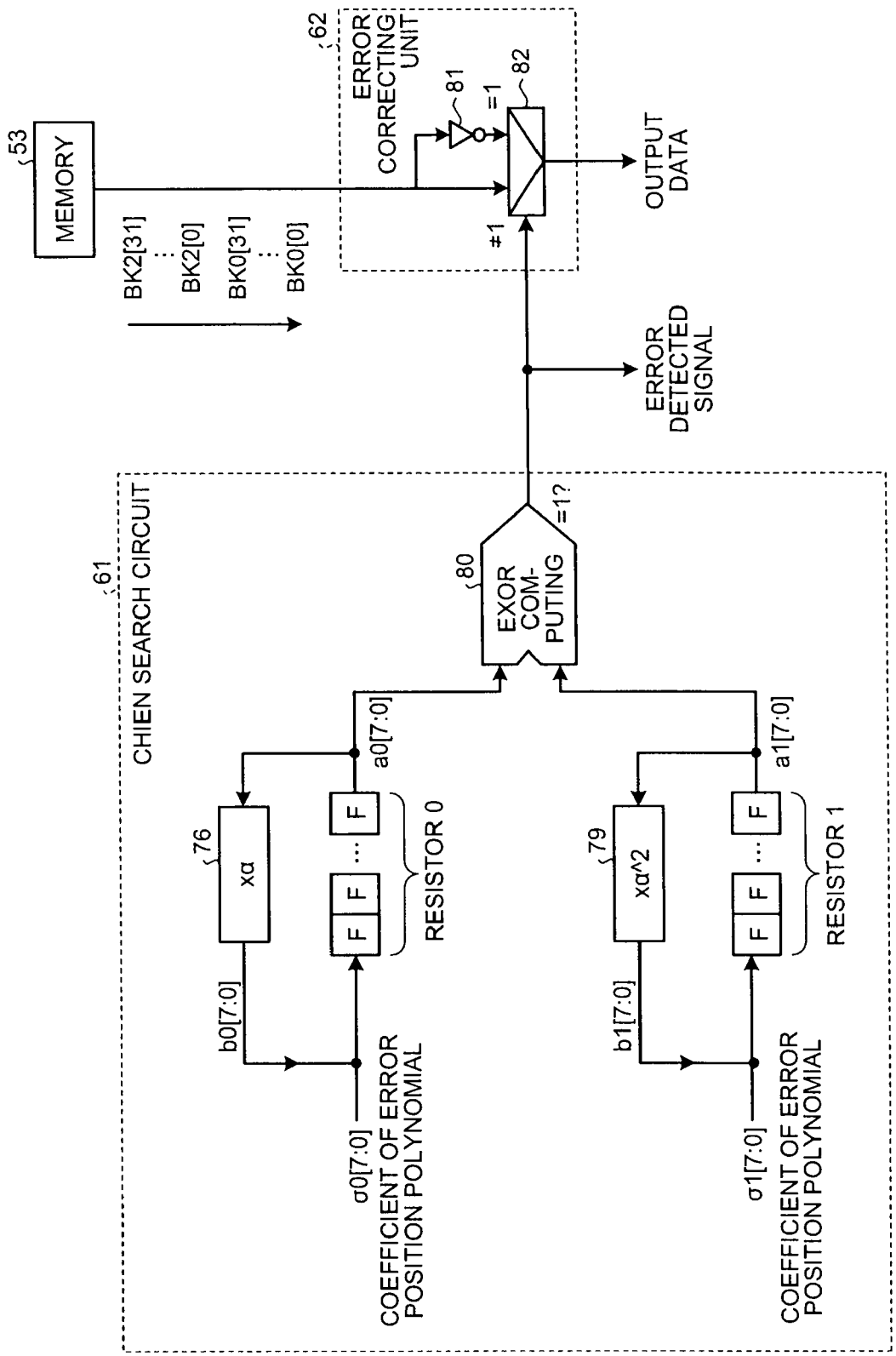
FIG. 13 is a diagram showing an example of the configuration of a Chien search circuit and an error correcting unit in an error locator calculator/error corrector.

FIG. 13 is a diagram showing an example of the configuration of the Chien search circuit 61 and the error correcting unit 62 in the error locator calculator/error corrector 101. In FIG. 13 and FIG. 8, sites having identical or equivalent functions have the same reference characters, and the overlapped description thereof will be omitted. The Chien search circuit 61 shown in FIG. 13 has a standard circuit configuration. In FIG. 13, the 32-bit processing unit and the 111-bit processing unit provided in FIG. 8 are not provided. In FIG. 13, the error-free area (padding area and area which has been determined to be free from an error after the first error correction) shown in FIG. 7B is also processed in the same manner as in the other areas. The output of the EXOR computing unit 80 is output as an error detected signal, wherein "1" represents the presence of an error and "0" represents the absence of an error, to the correction impossibility determinator 102.

Figure 14:
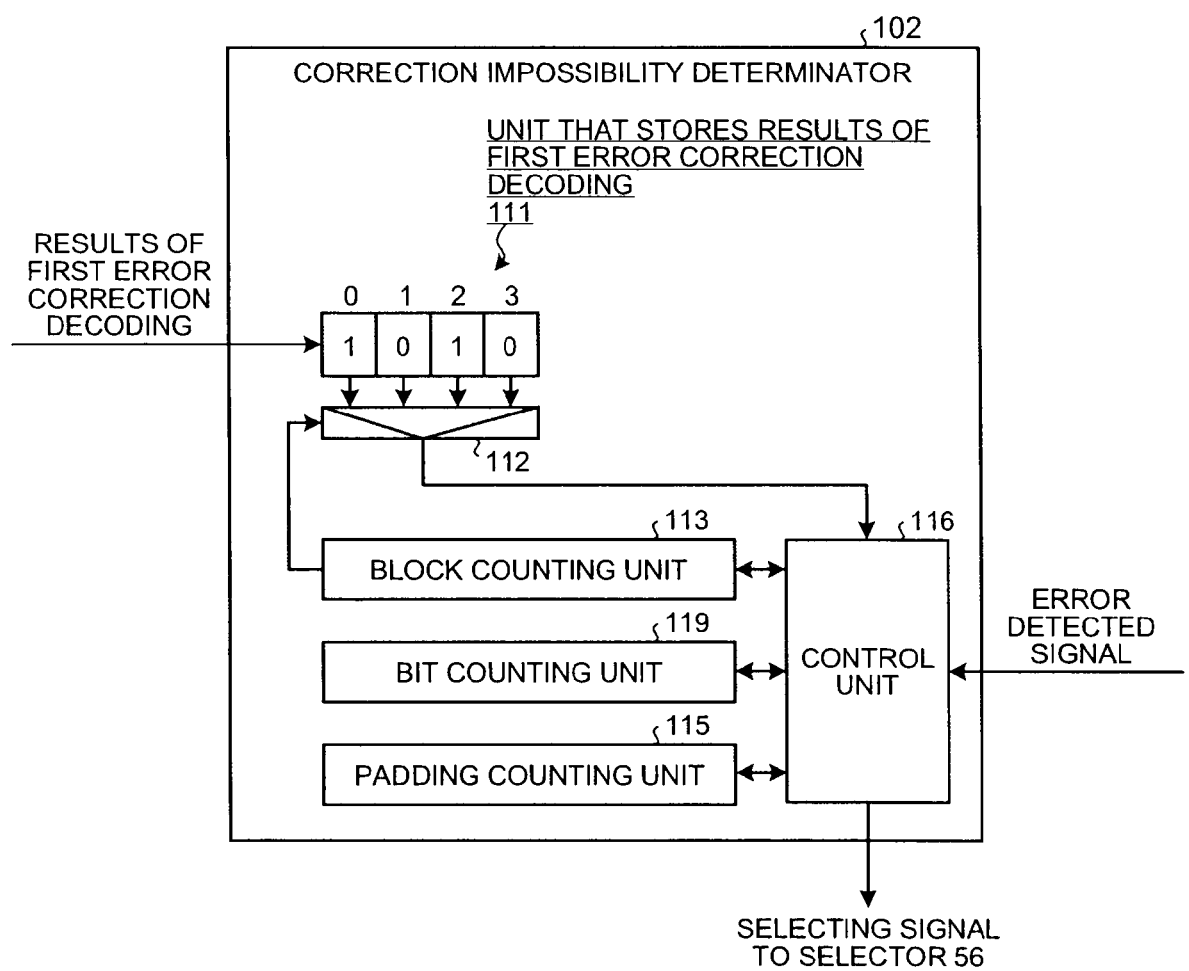
FIG. 14 is a diagram showing an example of the configuration of a correction impossibility determinator.

FIG. 14 is a diagram showing an example of the configuration of the correction impossibility determinator 102. As shown in FIG. 14, the correction impossibility determinator 102 includes a unit 111 that stores the results of the first error correction decoding, a selecting unit 112, a padding counting unit 115, a bit counting unit 119, a block counting unit 113, and a control unit 116.

The unit 111 that stores the results of the first error correction decoding stores the results of the first error correction decoding received from the first-error-correction decoding unit 42. The padding counting unit 115 counts a value in the padding counter, which indicates the current processing position in the padding area, and outputs the count to the control unit 116. The bit counting unit 119 counts a value in the bit counter, which indicates the current processing position in the block BK, and outputs the count to the control unit 116 and the selecting unit 112. The block counting unit 113 counts a value in the block counter, which indicates the current processing block position in the four blocks, and outputs the count to the control unit 116. The selecting unit 112 outputs, to the control unit 116, the results of the first error correction decoding in the block indicated by the value in the block counter and stored in the unit 111 that stores the results of the first error correction decoding. The control unit 116 determines the current processing position from the outputs of the padding counting unit 115, the block counting unit 113, and the bit counting unit 119 and determines, based on the results of the first error correction decoding stored in the unit 111 that stores the results of the first error correction decoding, whether the current processing position is an error-free area. Further, upon the receipt of an error detected signal ("1") from the error locator calculator/error corrector 101, when the current processing area is an error-free area, the control unit 116 determines that the error is uncorrectable. In this case, the control unit 116 ends the processing and outputs, to the selector 56, an abnormal signal indicating that the error is uncorrectable.

Figure 15:
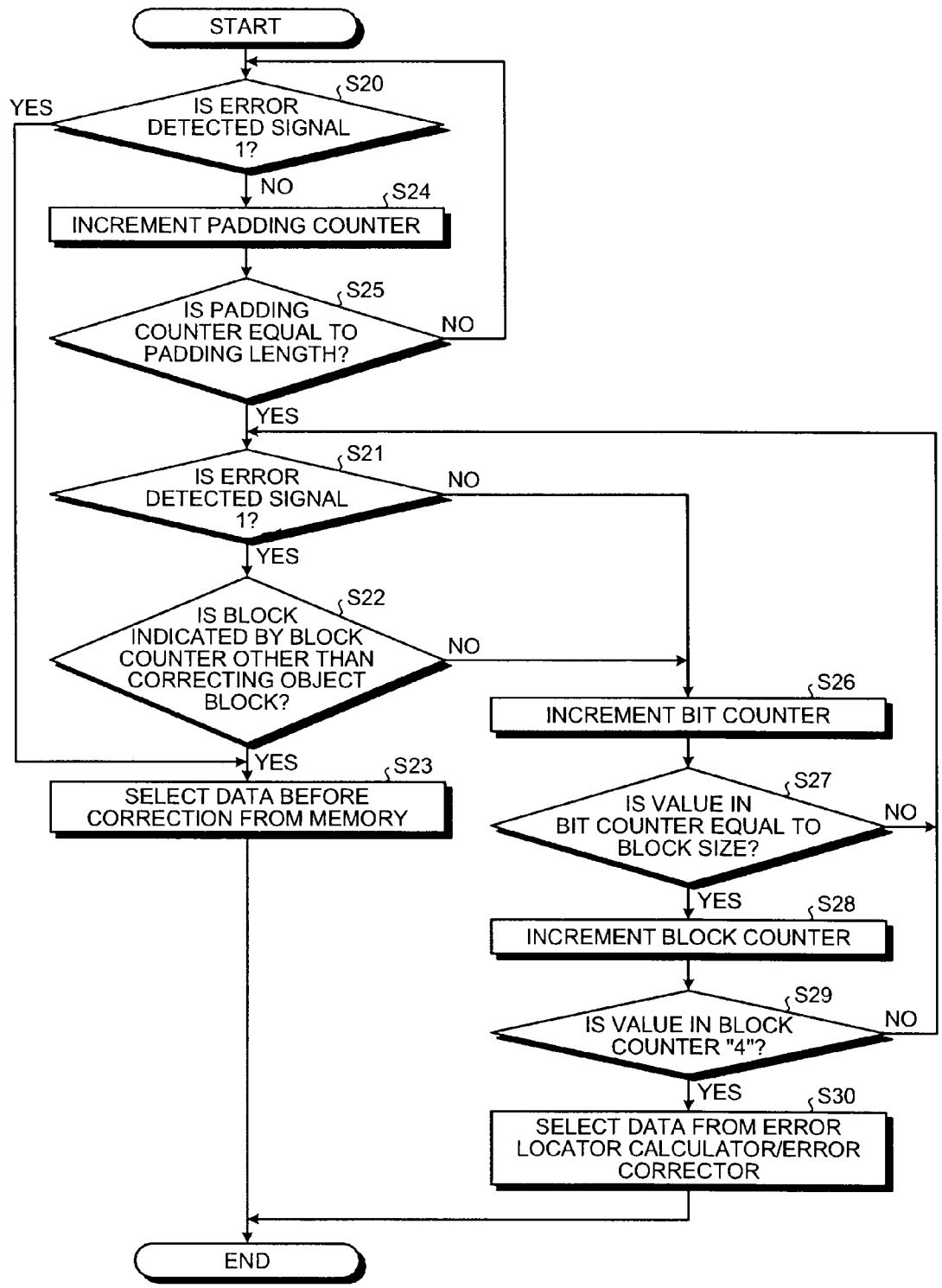
FIG. 15 is a diagram showing a flow chart that explains the operation of a correction impossibility determinator.

FIG. 15 is a flow chart that explains the operation of the correction impossibility determinator 102. In FIG. 15, at the outset, the control unit 116 determines whether the error detected signal is "1" (step S20). When the error detected signal is "1" ("Yes" in step S20), the data before the error correction from the memory 52 are selected. In this case, the control unit 116 outputs the data to the host device 4 (step S23). On the other hand, when the error detected signal is not "1" ("NO" in step S20), the padding counting unit 115 increments the value in the padding counter by "1" (step S24) and determines that the value in the padding counter is equal to or not equal to the padding length (step S25). When the value in the padding counter is not equal to the padding length ("No" in step S25), the step is returned to step S20. On the other hand, when the value in the padding counter is equal to the padding length ("Yes" in step S25), whether the next error detected signal is "1" is determined (step S21).

When the next error detected signal is not "1" ("No" in step S21), the step is transferred to step S26. On the other hand, when the error detected signal is "1" ("Yes" in step S21), whether the block indicated by the value in the block counter is other than the correcting object block is determined (step S22).

When the block indicated by the value in the block counter is other than the correcting object ("Yes" in step S22), the data before the correction are selected from the memory 52. In this case, data are output to the host device 4 (step S23). On the other hand, when the block indicated by the value in the block counter is not other than the correcting object block ("No" in step S22), the step is transferred to step S26.

In step S26, the bit counting unit 119 increments the value in the bit counter by "1", and whether the value in the bit counter is equal to the block size is determined (step S27). When the value in the bit counter is not equal to the block size ("NO" in step S27), the step is returned to step S21. On the other hand, when the value in the bit counter is equal to the block size ("Yes" in step S27), the block counting unit 113 increments the value in the block counter (step S28), and whether the value in the block counter is "4" is determined (step S29). When the value in the block counter is not "4" ("No" in step S29), the step is returned to step S21. On the other hand, when the value in the block counter is "4" ("Yes" in step S29), the data subjected to error correction in the error locator calculator/error corrector 101 are transferred to the host device 4 (step S30).

As described above, according to the second embodiment, the correction impossibility determinator 102 determines, based on the results of the first error correction received from the first-error-correction decoding unit 42 and the error detected signal received from the error locator calculator/error corrector 101, whether the error detected area is an error-free area (padding area and area which has been determined to be free from an error by the error detection). When the error detected area is an error-free area, the error is determined to be beyond the error correcting capability. Accordingly, whether an error is beyond the error correcting capability can be determined by using a simple configuration.

According to this embodiment, the block size is 32 bits, the BCH code size is 16 bits having a two-bit correcting capability, and the padding area is 111 bits. The present invention is not limited to these sizes, and the block size, the correcting capability and the size of the BCH code, and the size of the padding area each may be any value.

Further, according to this embodiment, the present invention is configured to be applicable to SSD having a NAND memory. Alternatively, the present invention may be configured to be applicable to SSD having other flash electrically erasable programmable read only memory (EEPROM) such as a NOR-type EEPROM.

Further, each of the functional blocks in each embodiment of the present invention can be realized as any one of or a combination of both a hardware and a computer software. Accordingly, each block will be explained below from the view point of these functions as a whole so that the blocks are clearly any of the above forms. Whether such functions are executed as the hardware or as the software depends upon specific embodiments or the restriction of design to the whole system. A person having ordinary skill in the art can realize these functions by various methods depending upon specific embodiments, and the determination of such realization is included in the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An error correcting device for data read out from a nonvolatile memory, the error correcting device comprising:
 a first error correcting unit, including
  a first error number calculating unit configured to calculate a first error number in the data; and
  a second error number calculating unit configured to calculate a second error number in a correction object area of the data, the data including the correction object area and an error-free area; and
 a comparing unit configured to compare the first error number and the second error number, wherein
 the error correcting device is configured to not perform first error correction on the data when the first error number is not equal to the second error number.

2. The error correcting device according to claim 1, further comprising:
 a second error correcting unit configured to perform second error correction on the data read from the nonvolatile memory and to output a result to the first error correcting unit, wherein the correction object area of the data includes an error bit after the second error correction performed by the second error correcting unit.

3. The error correcting device according to claim 2, wherein the error-free area is at least one of a padding area and an area that has been determined to be free from an error.

4. The error correcting device according to claim 1, wherein the second error number calculating unit is configured to perform a Chien search from a lead of the data, when calculating the second error number.

5. The error correcting device according to claim 1, wherein
 the data is stored in the non-volatile memory associated with a first error correcting code and a second error correcting code, wherein the first error correcting code is generated for each block, and the second error correcting code is generated for a group of blocks.

6. The error correcting device according to claim 5, further comprising:
 a first-error-correction decoding unit configured to perform first error correction of the data read out from the nonvolatile memory using the first error correcting code; and
 a second-error-correction decoding unit configured to perform the second error correction of the data subjected to the first error correction.

7. The error correcting device according to claim 5, wherein the first error correcting code is a hamming code.

8. The error correcting device according to claim 5, wherein the second error correcting code is a Bose-Chaudhuri-Hocquenghem code or a Reed-Solomon code.

9. The error correcting device according to claim 1, wherein the nonvolatile memory is a NAND-type flash memory.

10. An error correcting method for data read from a nonvolatile memory, the error correcting method comprising:
calculating a first error number in the data;
calculating a second error number in a correction object area of the data, the data including the correction object area and an error-free area;
comparing the first error number and the second error number; and
performing first error correction when the first error number and the second error number are equal.

11. The error correcting method according to claim 10, further comprising:
performing second error correction on the data read from the non-volatile memory, wherein the correction object area of the data includes an error bit after the second error correction.

12. The error correcting method according to claim 11, wherein the error-free area is at least one of a padding area and an area that has been determined to be free from an error.

13. The error correcting method according to claim 10, wherein the step of calculating the second error number comprises performing a Chien search from a lead of the data when calculating the second error number.

14. The error correcting method according to claim 10, wherein the nonvolatile memory is a NAND-type flash memory.

* * * * *